(12) United States Patent
Murata

(10) Patent No.: US 12,581,844 B2
(45) Date of Patent: Mar. 17, 2026

(54) METHOD OF MANUFACTURING A DISPLAY DEVICE

(71) Applicant: Magnolia White Corporation, Tokyo (JP)

(72) Inventor: Ryosuke Murata, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 536 days.

(21) Appl. No.: 18/079,016

(22) Filed: Dec. 12, 2022

(65) Prior Publication Data

US 2023/0189624 A1 Jun. 15, 2023

(30) Foreign Application Priority Data

Dec. 15, 2021 (JP) ................................. 2021-203402

(51) Int. Cl.
| | |
|---|---|
| *H01L 29/08* | (2006.01) |
| *H10K 59/122* | (2023.01) |
| *H10K 71/00* | (2023.01) |
| *H10K 71/20* | (2023.01) |
| *H10K 59/12* | (2023.01) |
| *H10K 59/80* | (2023.01) |

(52) U.S. Cl.
CPC ........... *H10K 71/00* (2023.02); *H10K 59/122* (2023.02); *H10K 71/231* (2023.02); *H10K 59/1201* (2023.02); *H10K 59/8051* (2023.02); *H10K 59/8052* (2023.02); *H10K 59/873* (2023.02)

(58) Field of Classification Search
CPC .... H10K 71/00; H10K 59/122; H10K 71/231; H10K 59/1201
USPC ............................................................ 257/40
See application file for complete search history.

(56) References Cited

U.S. PATENT DOCUMENTS

| | | | |
|---|---|---|---|
| 2009/0284135 A1 | 11/2009 | Yoshida et al. | |
| 2014/0145157 A1* | 5/2014 | Kim ....................... | H10K 59/00 257/40 |

FOREIGN PATENT DOCUMENTS

| | | | | |
|---|---|---|---|---|
| CN | 111009568 A | * | 4/2020 | ............. H10K 59/12 |
| JP | 2009-187957 A | | 8/2009 | |
| KR | 20200080742 A | * | 7/2020 | ........... H10K 59/122 |
| WO | WO-2013038970 A1 | * | 3/2013 | ........... H10K 59/878 |

* cited by examiner

*Primary Examiner* — Phuc T Dang

(74) *Attorney, Agent, or Firm* — XSENSUS LLP

(57) ABSTRACT

According to one embodiment, a method of manufacturing a display device, a substrate including a pair of partitions and a lower electrode disposed between the pair of partitions is formed. Then, an organic EL layer including a first portion including a pair of end surfaces which cover the lower electrode and are in contact with side surfaces of the pair of partitions, and a second portion located on each of the pair of partitions and spaced apart from the first portion, is formed. Thereafter, the second portion is removed by etching. Further, an upper electrode which covers the first portion is formed.

12 Claims, 12 Drawing Sheets

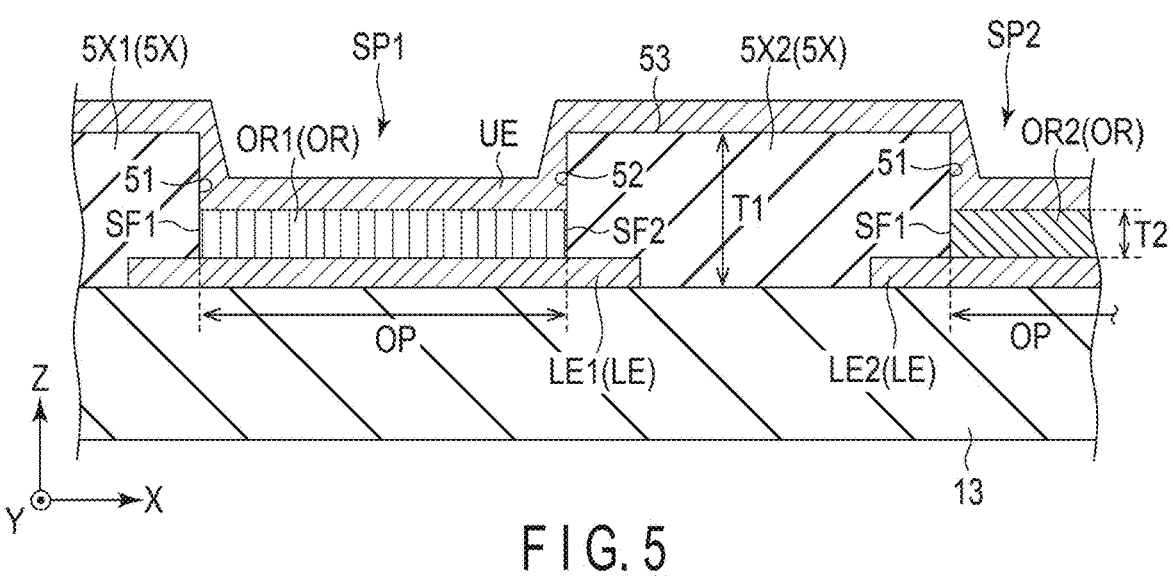
F I G. 5
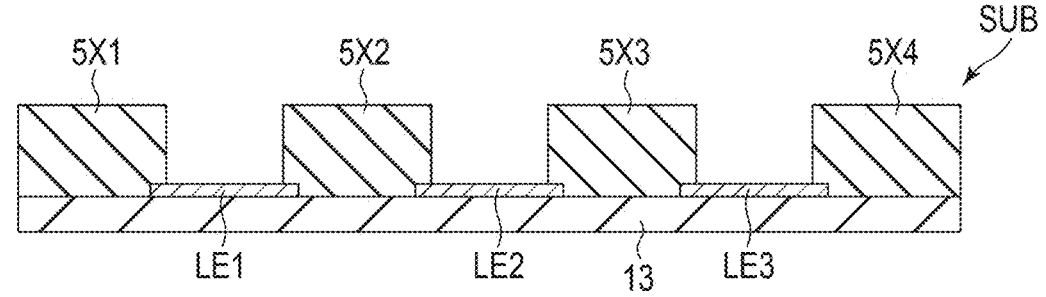
F I G. 6A
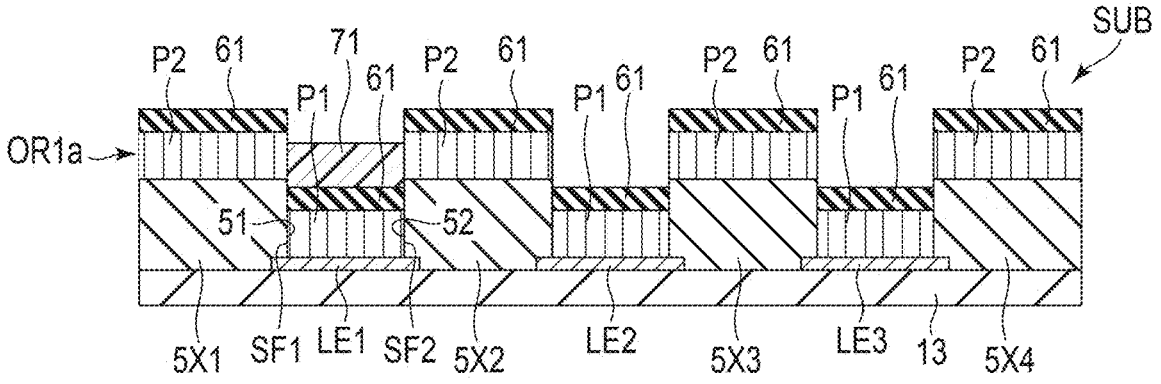
F I G. 6B

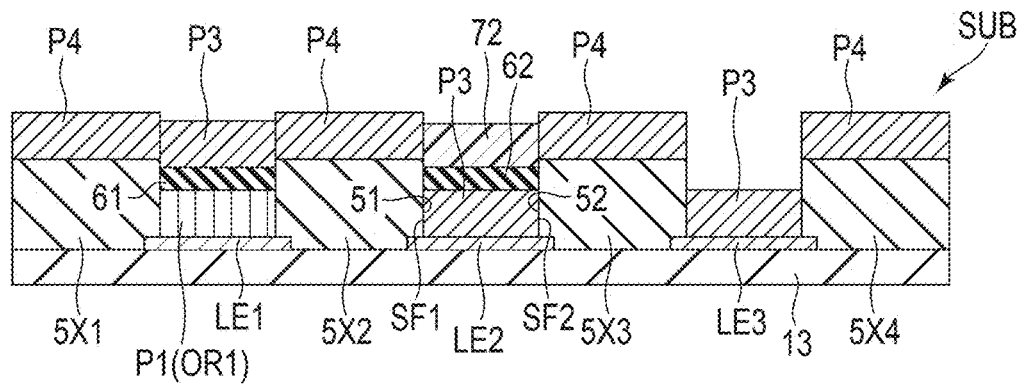
F I G. 6F
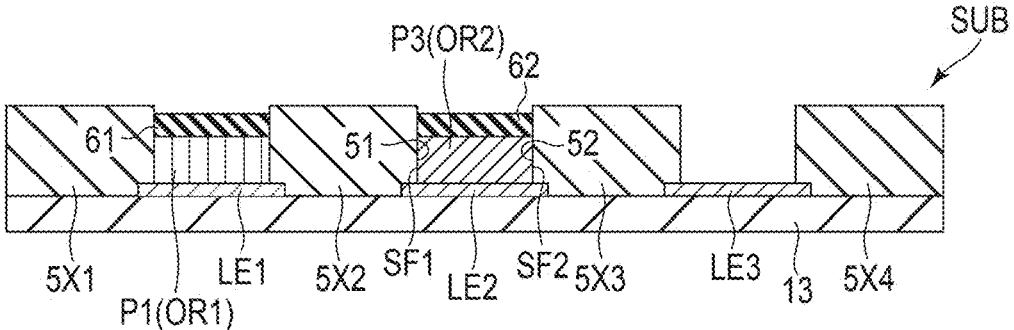
F I G. 6G
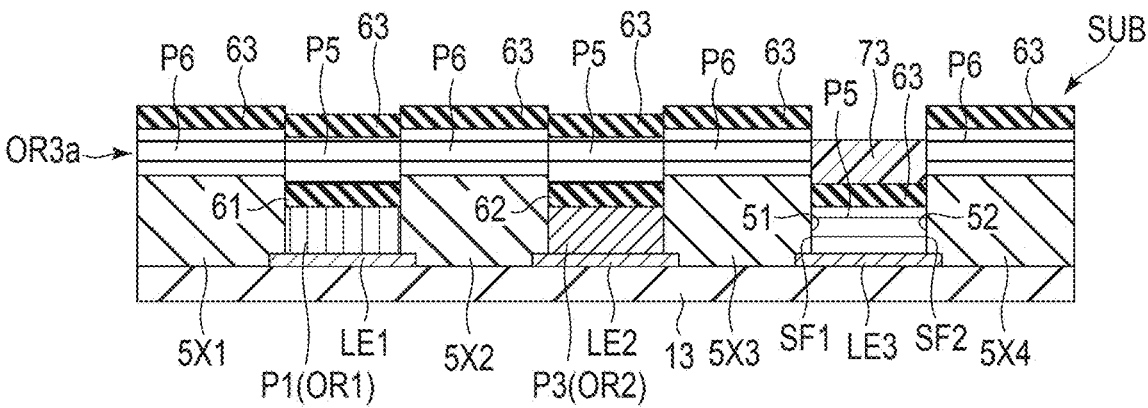
F I G. 6H

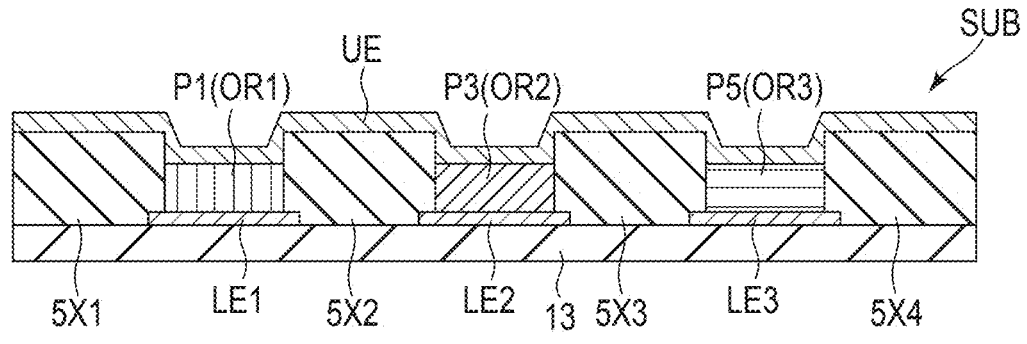
F I G. 6L
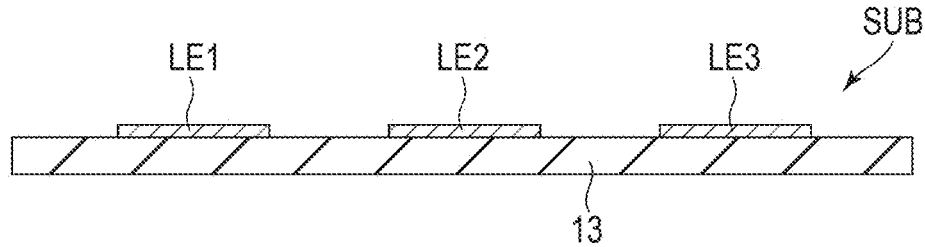
F I G. 7A
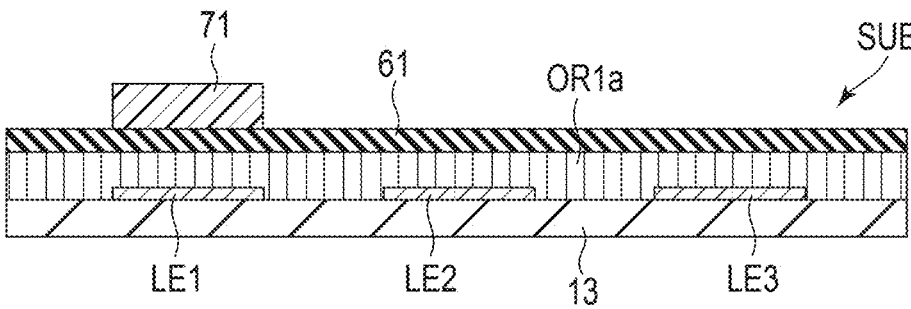
F I G. 7B

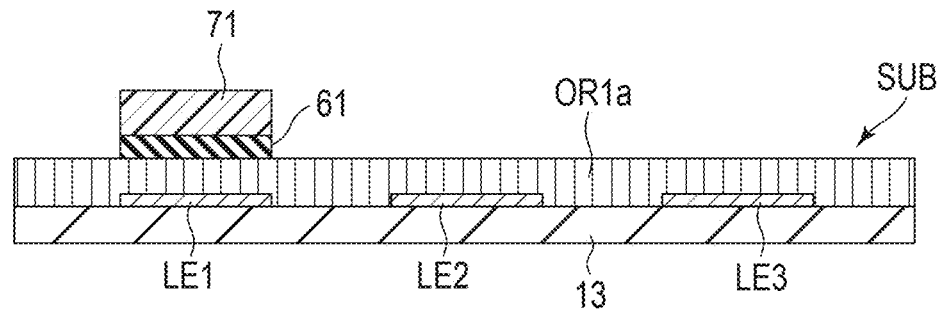
F I G. 7C
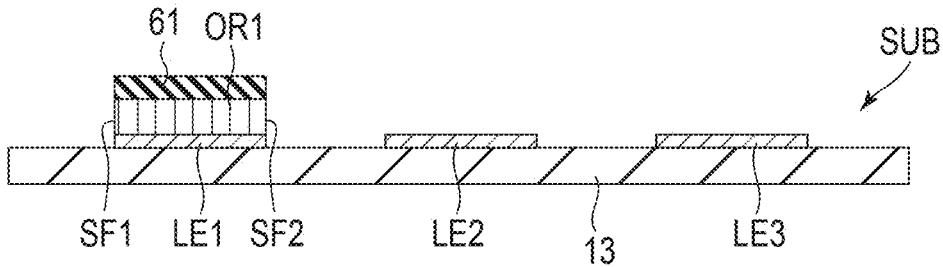
F I G. 7D
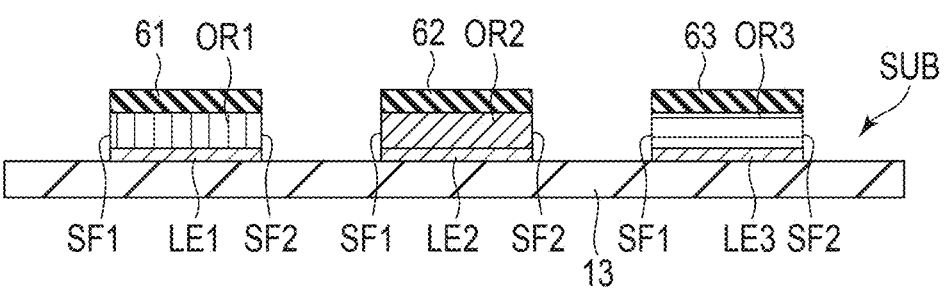
F I G. 7E

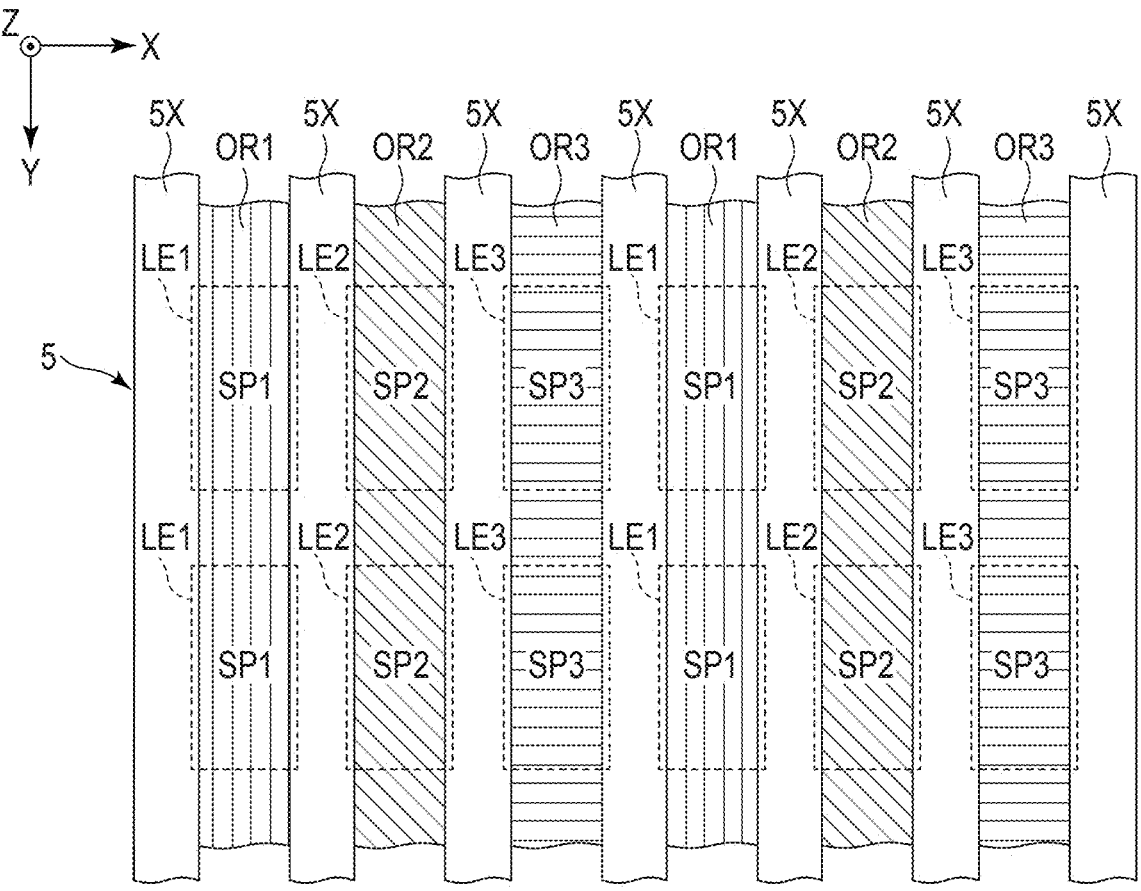
F I G. 10

METHOD OF MANUFACTURING A DISPLAY DEVICE

CROSS-REFERENCE TO RELATED APPLICATIONS

This application is based upon and claims the benefit of priority from Japanese Patent Application No. 2021-203402, filed Dec. 15, 2021, the entire contents of which are incorporated herein by reference.

FIELD

Embodiments described herein relate generally to a display device and a method of manufacturing the same.

BACKGROUND

Recently, display devices to which an organic light emitting diode (OLED) is applied as a display element have been put into practical use. Such a display element comprises a lower electrode, an upper electrode and an organic electroluminescent (EL) layer disposed between these electrodes. The organic EL layer includes a light-emitting layer which emits light according to voltage between the lower and upper electrodes.

For example, when the organic EL layer is patterned by etching, the upper surface of the organic EL layer can be covered by a protective film which remains after etching, but an end portion of the organic EL layer is exposed to the atmosphere. If moisture penetrates through the exposed end portion, the organic EL layer may deteriorate, and some countermeasures are required. Countermeasures against moisture penetration into the organic EL layer are necessary for display devices after manufacturing as well.

BRIEF DESCRIPTION OF THE DRAWINGS

FIG. 5 is a partially enlarged schematic cross-sectional view of the drawing of FIG. 3.

FIG. 6A is a diagram showing a part of a manufacturing process of a display device.

FIG. 6B is a diagram showing a manufacturing process of the display device, which follows that of FIG. 6A.

FIG. 6F is a diagram showing a manufacturing process of the display device, which follows that of FIG. 6E.

FIG. 6G is a diagram showing a manufacturing process of the display device, which follows that of FIG. 6F.

FIG. 6H is a diagram showing a manufacturing process of the display device, which follows that of FIG. 6G.

FIG. 6L is a diagram showing a manufacturing process of the display device, which follows that of FIG. 6K.

FIG. 7A is a diagram showing a part of a manufacturing process of a display device according to a comparative example.

FIG. 7B is a diagram showing a manufacturing process of the display device, which follows that of FIG. 7A.

FIG. 7C is a diagram showing a manufacturing process of the display device, which follows that of FIG. 7B.

FIG. 7D is a diagram showing a manufacturing process of the display device, which follows that of FIG. 7C.

FIG. 7E is a diagram showing a manufacturing process of the display device, which follows that of FIG. 7D.

FIG. 10 is a diagram showing an example of layout of sub-pixels according to the second modified example.

DETAILED DESCRIPTION

Figure 1:
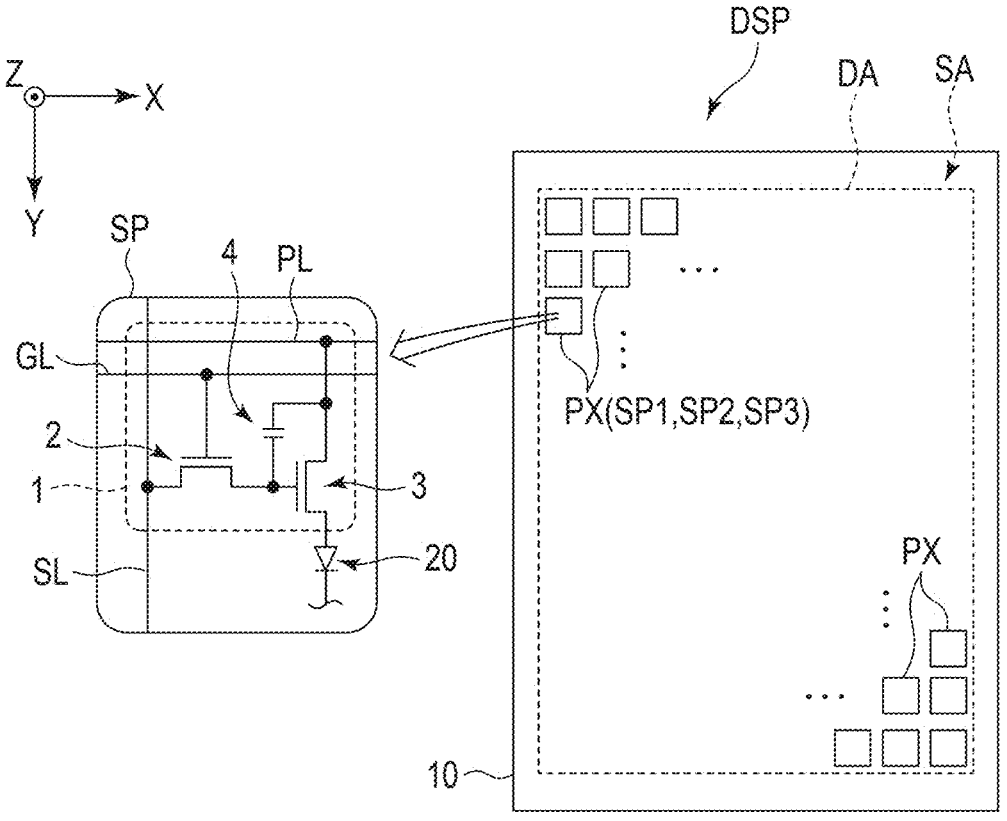
FIG. 1 is a diagram showing a configuration example of a display device according to a first embodiment.

In general, according to one embodiment, in a method of manufacturing a display device, a substrate including a pair of partitions and a lower electrode disposed between the pair of partitions is formed. Then, an organic EL layer including a first portion having a pair of end surfaces which cover the lower electrode and are in contact with side surfaces of the pair of partitions, and a second portion located on each of the pair of partitions and spaced apart from the first portion, is formed. Thereafter, the second portion is removed by etching. Further, an upper electrode which covers the first portion is formed.

According to another aspect of the embodiment, in a method of manufacturing a display device, a substrate is formed to include a first partition, a second partition, a third partition and a fourth partition, a first lower electrode disposed between the first partition and the second partition, a second lower electrode disposed between the second partition and the third partition, and a third lower electrode disposed between the third partition and the fourth partition. Then, a first organic EL layer is formed to include a first portion which covers the first lower electrode and includes a pair of end surfaces which are in contact with side surfaces of the first partition and the second partition, respectively, and a second portion located on the first partition and the second partition and spaced apart from the first portion. The second portion is removed by first etching. Then, a second organic EL layer is formed to include a third portion which covers the second lower electrode and includes a pair of end surfaces which are in contact with side surfaces of the second partition and the third partition, respectively, and a fourth portion located on the second partition and the third partition and spaced apart from the third portion. The fourth portion is removed by second etching. Then, a third organic EL layer is formed to include a fifth portion which covers the third lower electrode and includes a pair of end surfaces which are in contact with side surfaces of the third partition and the fourth partition, respectively, and a sixth portion located on the third partition and the fourth partition and spaced apart from the fifth portion. The sixth portion is removed by third etching. Thereafter, an upper electrode which covers the first portion, the third portion and the fifth portion is formed.

According to the embodiment, a display device comprises a pair of partitions, a lower electrode disposed between the pair of partitions, an organic EL layer which covers the lower electrode and having a pair of end surfaces which are in contact with side surfaces of the pair of partitions, respectively, and an upper electrode which covers the organic EL layer. Further, the side surfaces of the pair of partitions are substantially parallel to a thickness direction of the organic EL layer, and a thickness of the pair of partitions is less than or equal to three times a thickness of the organic EL layer.

According to the manufacturing method and display device described above, it is possible to suppress degradation of the organic EL layer.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated in the drawings schematically, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as a first direction. A direction parallel to the Y-axis is referred to as a second direction. A direction parallel to the Z-axis is referred to as a third direction. A plane defined by the X axis and the Y axis is referred to as an X-Y plane, and a plane defined by the X axis and the Z axis is referred to as an X-Z plane. Further, viewing towards the X-Y plane is referred to as planar view.

The display device DSP of each embodiment is an organic electroluminescent display device comprising an organic light emitting diode (OLED) as a display element, and could be mounted on a television, a personal computer, a vehicle-mounted device, a tablet, a smartphone, a mobile phone, etc.

First Embodiment

FIG. 1 is a diagram showing a configuration example of a display device DSP according to the first embodiment. The display device DSP comprises a display area DA which displays images and a surrounding area SA around the display area DA on an insulating base 10.

The base 10 may be glass or a resinous film having flexibility.

The display area DA comprises a plurality of pixels PX arrayed in matrix along the first direction X and the second direction Y. Each pixel PX includes a plurality of subpixels SP. For example, each pixel PX includes a red subpixel SP1, a green subpixel SP2 and a blue subpixel SP3. Each pixel PX may include four or more subpixels SP including another subpixel of a color such as white in addition to the subpixels SP1, SP2 and SP3 described above.

The subpixels SP each comprise a pixel circuit 1 and a display element 20 driven by the pixel circuit 1. The pixel circuit 1 comprises a pixel switch 2, a drive transistor 3 and a capacitor 4. The pixel switch 2 and the drive transistor 3 are, for example, switching elements consisting of thin-film transistors.

In the pixel switch 2, a gate electrode is connected to a scanning line GL. One of source and drain electrodes of the pixel switch 2 is connected to a signal line SL, and the other is connected to a gate electrode of the drive transistor 3 and the capacitor 4. In the drive transistor 3, one of source and drain electrodes is connected to a power line PL and the capacitor 4, and the other is connected to an anode of the display element 2. The configuration of the pixel circuit 1 is not limited to that of the example shown in the figure.

The display element 20 is an organic light-emitting diode (OLED) as a light-emitting element. For example, a sub-pixel SP1 comprises a display element 20 which emits light corresponding to a red wavelength, a sub-pixel SP 2 comprises a display element 20 which emits light corresponding to a green wavelength, and a sub-pixel SP3 comprises a display element 20 which emits light corresponding to a blue wavelength. The configuration of the display elements 20 will be described later.

Figure 2:
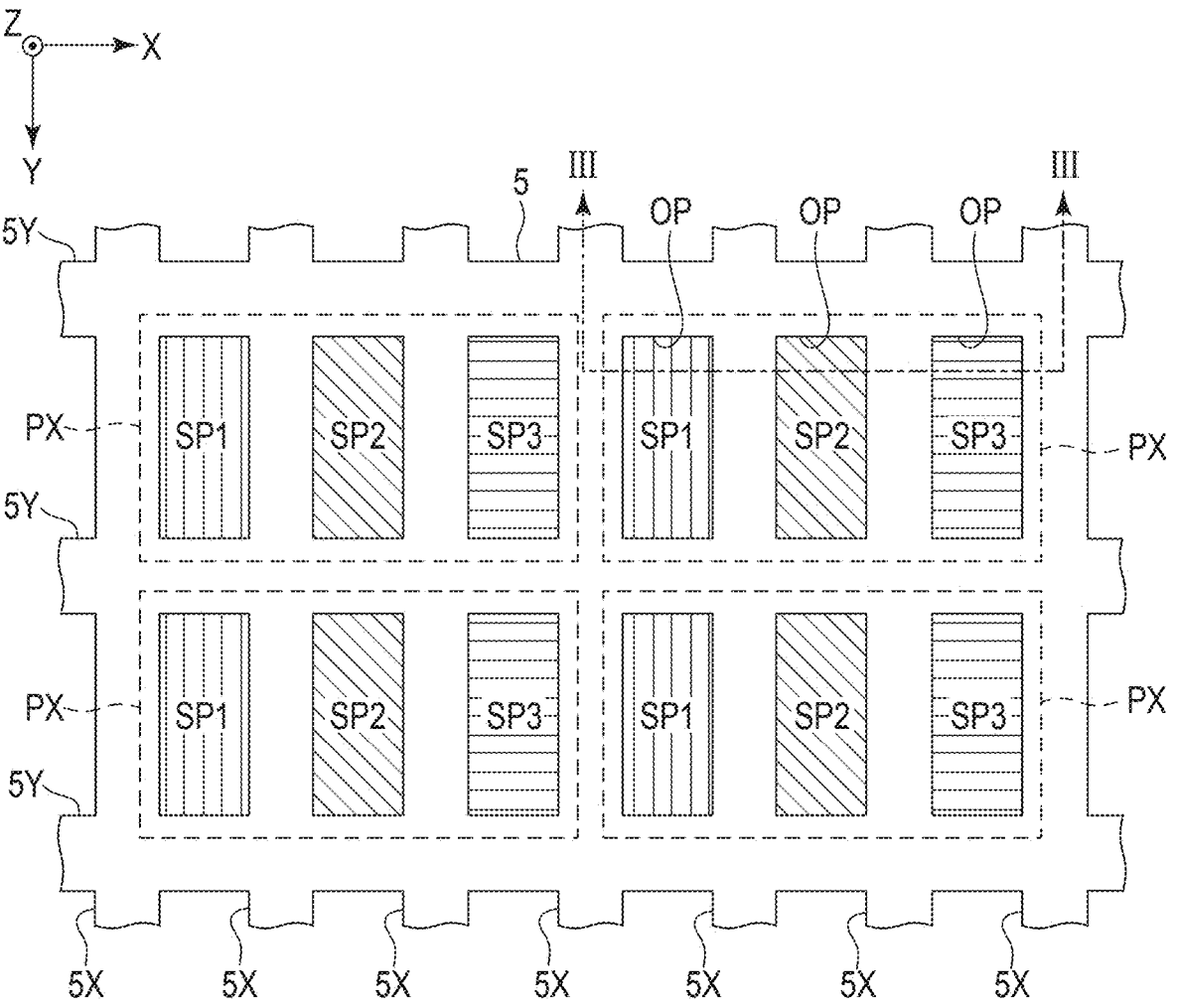
FIG. 2 is a diagram showing an example of layout of subpixels.

FIG. 2 is a diagram showing an example of the layout of the sub-pixels SP1, SP2 and SP3. Here, four pixels PX are focused. In each of the pixels PX, the sub-pixels SP1, SP2 and SP3 are aligned in this order along the first direction X. That is, in the display area DA, columns of a plurality of sub-pixels SP1 aligned along the second direction Y, columns of a plurality of sub-pixels SP2 aligned along the second direction X, and columns of a plurality of sub-pixels SP3 aligned along the second direction Y are arranged alternately along the first direction X.

At the boundaries of the sub-pixels SP1, SP2 and SP3, partitions 5 are disposed. In the example shown in FIG. 2, the partitions 5 are arranged in a lattice form including a plurality of partitions 5X each located between each adjacent pair of sub-pixels SP along the first direction X and a plurality of partitions 5Y each located between each adjacent pair of sub-pixels SP along the second direction Y. In the example of FIG. 2, the partitions 5X extend parallel to the second direction Y and the partitions 5Y extend parallel to the first direction X. With the partitions 5X and 5Y, openings OP are formed in the sub-pixels SP1, SP2 and SP3, respectively.

Figure 3:
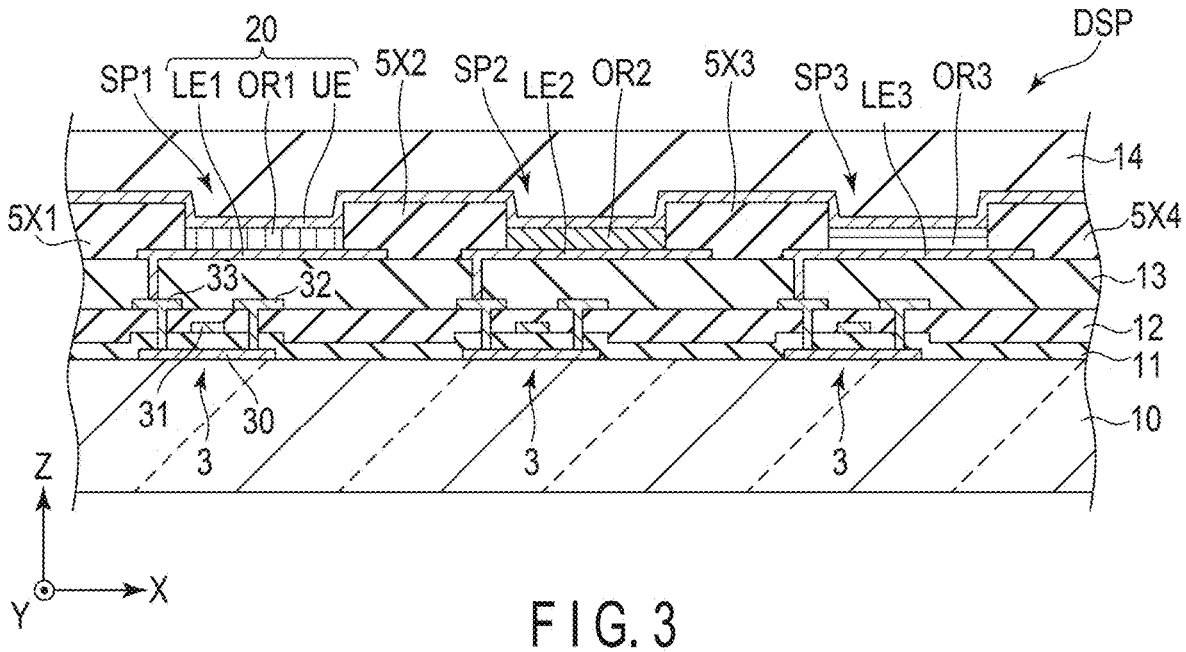
FIG. 3 is a schematic cross-sectional view of the display device taken along line III-III in FIG. 2.

FIG. 3 is a cross-sectional view schematically showing the display device DSP taken along line III-III line in FIG. 2. In FIG. 3, drive transistors 3 and display elements 20 are illustrated as elements disclosed in the sub-pixels SP1, SP2, SP3 and other elements are omitted from the illustration.

The display device DSP comprises the base 10 described above, insulating layers 11, 12 and 13, the partitions 5X described above, and a sealing layer 14. The insulating layers 11, 12 and 13 are stacked along the third direction Z on the base 10. For example, the insulating layers 11, 12 are formed of inorganic materials, whereas the insulating layer 13, the partitions 5X and the sealing layer 14 are formed of organic materials. The partitions 5Y shown in FIG. 2 are formed to be integrated with the partitions 5X as one body from the same material as that of the partition 5X.

The drive transistor 3 comprises a semiconductor layer 30 and electrodes 31, 32 and 33. The electrode 31 corresponds to a gate electrode. One of the electrodes 32 and 33 corresponds to a source electrode and the other corresponds to a drain electrode. The semiconductor layer 30 is disposed between the base 10 and the insulating layer 11. The electrode 31 is disposed between the insulating layers 11 and 12. The electrodes 32 and 33 are disposed between insulating layers 12 and 13, and are in contact with the semiconductor layer 30 via contact holes that penetrate the insulating layers 11 and 12.

The display element 20 comprises a lower electrode LE, an organic EL layer OR, and an upper electrode UE. The lower electrode LE is an electrode provided for each sub-pixel SP and may be referred to as a pixel electrode. The upper electrode UE is an electrode provided commonly for multiple display elements 20 and may be referred to as a common electrode. The organic EL layer OR is disposed between the lower electrode LE and the upper electrode UE.

In the following descriptions, the lower electrode LE disposed in the sub-pixel SP1 is referred to as a first lower electrode LE1, the lower electrode LE disposed in the sub-pixel SP2 is referred to as a second lower electrode LE2, and the lower electrode LE disposed in the sub-pixel SP3 is referred to as a third lower electrode LE3. Further, the organic EL layer OR disposed in the sub-pixel SP1 is referred to as a first organic EL layer OR1, the organic EL layer OR disposed in the sub-pixel SP2 is referred to as a second organic EL layer OR2, and the organic EL layer OR disposed in the sub-pixel SP3 is referred to as a third organic EL layer OR3. Moreover, the four partitions 5X shown in FIG. 3 are, from left to right, referred to as a first partition 5X1, a second partition 5X2, a third partition 5X3 and a fourth partition 5X4.

The lower electrodes LE1, LE2 and LE3 are disposed on the insulating layer 13. The partitions 5X1, 5X2, 5X3 and 5X4 as well are disposed on the insulating layer 13. In the example of FIG. 3, the partitions 5X1 and 5X2 cover respective end portions of the first lower electrode LE1 in the first direction X, the partitions 5X2 and 5X3 cover respective end portions of the second lower electrode LE2 in the first direction X, and the partitions 5X3 and 5X4 cover respective end portions of the third lower electrode LE3 in the first direction X. Although not shown in the cross section in FIG. 3, partitions 5Y are similarly disposed on the insulating layer 13 and cover both end portions of each of the lower electrodes LE1, LE2 and LE3 in the second direction Y. In planar view, the lower electrodes LE1, LE2 and LE3 3 overlap the openings OP shown in FIG. 2, respectively.

The lower electrodes LE1, LE2 and LE3 are electrically connected to electrodes 33 via respective contact holes which penetrate the insulating layer 13. The lower electrodes LE1, LE2 and LE3 are formed of a metal material. Note here that the lower electrodes LE1, LE2 and LE3 may be formed of a transparent conductive material such as indium tin oxide (ITO), indium zinc oxide (IZO) or the like, or may be a stacked body of a transparent conductive material and a metal material.

The first organic EL layer OR1 is located between the partitions 5X1 and 5X2 along the first direction X and covers the first lower electrode LE1. The second organic EL layer OR2 is located between the partitions 5X2 and 5X3 in the first direction X and covers the second lower electrode LE2. The third organic EL layer OR3 is located between the partitions 5X3 and 5X4 in the first direction X and covers the third lower electrode LE3. Although not shown in the cross section of FIG. 3, the organic EL layers OR1, OR2 and OR3 are located between adjacent partitions 5Y in the second direction Y. That is, the organic EL layers OR1, OR2 and OR3 fill the insides of the openings OP shown in FIG. 2 in planar view, respectively.

The upper electrode UE covers the organic EL layers OR1, OR2 and OR3 and the partitions 5X1, 5X2 and 5X4. The upper electrode UE is formed of a metal material. Note that the upper electrode UE may be formed of a transparent conductive material such as ITO or IZO.

The sealing layer 14 is disposed on the upper electrode UE. The sealing layer 14 is formed thicker than, for example, the insulating layers 11, 12 and 13 and the partitions 5X1, 5X2, 5X3 and 5X4. The sealing layer 14 protects the organic EL layers OR1, OR OR1, OR2, OR3 and OR4 from moisture or the like, and also planarizes the unevenness created by the partitions 5X1, 5X2, 5X3 and 5X4.

Figure 4:
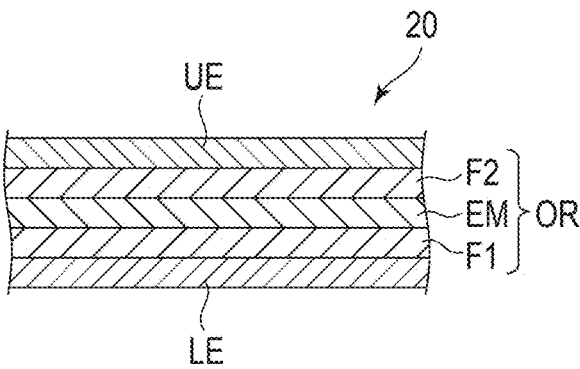
FIG. 4 is a cross-sectional view schematically showing an example of a layer configuration which can be applied to an organic EL layer.

FIG. 4 is a cross-sectional view showing an example of a layer configuration that can be applied to the organic EL layers OR (OR1, OR2, OR3 and OR4). For example, the organic EL layers OR include a first functional layer F1, a light-emitting layer EM and a second functional layer F2 stacked in order from the lower electrodes LE (LE1, LE2, LE3 and LE4) to the upper electrode UE.

When the potential of the lower electrodes LE is relatively higher than that of the upper electrode UE, the lower electrode LE correspond to the anode and the upper electrode UE corresponds to the cathode. On the other hand, when the potential of the upper electrode UE is relatively higher than that of the lower electrode LE, the upper electrode UE corresponds to the anode and the lower electrode LE correspond to the cathode.

For example, when the lower electrodes LE correspond to the anode, the first functional layer F1 includes at least one of a hole injection layer, a hole transport layer and an electron blocking layer, and the second functional layer F2 includes at least one of an electron transport layer, an electron injection layer and a hole blocking layer.

When a potential difference is created between the lower electrodes LE and the upper electrode UE, the emitting layer EM emits light. In this embodiment, such a case is assumed that the light-emitting layer EM of the first organic EL layer OR1 emits red light, the light-emitting layer EM of the second organic EL layer OR2 emits green light, and the light-emitting layer EM of the third organic EL layer OR3 emits blue light. As another example, it may be assumed that the emitting layers EM of the organic EL layers OR1, OR2 and OR3 emit light of the same color (for example, white). In this case, for example, color filters corresponding to the colors of the sub-pixels SP1, SP2 and SP3 may be disposed above the sealing layer 14. Further, layers containing quantum dots generate light of the colors according to the sub-pixels SP1, SP2 and SP3 as excited by the light emitted by the light-emitting layer EM may be arranged on the sub-pixels SP1, SP2 and SP3, respectively.

FIG. 5 is a partially enlarged schematic cross-sectional view of the illustration of FIG. 3. Note that FIG. 5 mainly shows the first organic EL layer OR1, the second organic EL layer OR2, the first partition 5X1 and the second partition 5X2, and other organic EL layers OR and partitions 5X have respective shapes similar to those mentioned.

The partitions 5X each include a pair of side surfaces 51 and 52, which intersect the first direction X and an upper surface which connects the side surfaces 51 and 52. In this embodiment, the side surfaces 51 and 52 are substantially parallel to the third direction Z(, which is a thickness direction of the organic EL layers OR, the lower electrodes LE, the insulating layer 13 and a substrate SUB, which will be described later). Here, the expression "the side surfaces 51 and 52 are substantially parallel to the third direction Z" covers not only the case where the side surfaces 51 and 52 in their entirety are parallel to the third direction Z, but also the case where the side surfaces 51, 52 are inclined at about a few degree with respect to the third direction Z, and the case where the side surfaces 51 and 52 are partially inclined to the third direction Z but a large part of the side surfaces 51 and 52 is parallel to the third direction Z. From some other point of view, the side surfaces 51 and 52 are substantially normal to the upper surface of the insulating layer 13, the upper surface of the lower electrode LE, the upper surface of the organic EL layer OR, and an upper surface 53 of each partition 5X, and the like.

The organic EL layer OR includes a pair of end surfaces SF1 and SF2, which intersect the first direction X. In the example of FIG. 5, the end surface SF1 of the first organic EL layer OR1 is in contact with the side surface 51 of the first partition 5X1, and the end surface SF2 of the first organic EL layer OR1 is in contact with the side surface 52 of the second partition 5X2. That is, the end surfaces SF1 and SF2 of each organic EL layer OR are in contact with one side surface 51 and the other side surface 52 of a pair of partitions 5X adjacent to each other along the first direction X 52, respectively.

The end surfaces SF1 and SF2 include end surfaces of, for example, the functional layers F1 and F2 and the light-emitting layer EM shown in FIG. 4. But, the end surfaces SF1 and SF2 may not include the end surface any one of the functional layers F1 and F2 and the light-emitting layer EM.

The partitions 5X each have a thickness T1 along the third direction Z. The organic EL layer OR has a thickness T2 along the third direction Z. The thickness T1 is greater than the thickness T2 (T1>T2). The thickness T1 corresponds to the distance from the insulating layer 13 to the upper surface 53. When the upper surface 53 is not flat (parallel to the X-Y plane), the thickness T1 may be an average thickness of the partitions 5X.

In this embodiment, the thickness T1 is equal to or less than three times the thickness T2. The thickness T1 may be less than twice the thickness T2. For example, the thickness T1 is 500 nm to 600 nm and the thickness T2 is 200 nm to 300 nm. For example, the thicknesses T2 of the organic EL layers OR1, OR2 and OR3 are equal to each other, but the thicknesses may be different from each other.

Note that in conventionally known OLED-type display devices, members called ribs or banks may be disposed the boundaries between the sub-pixels. The thickness of such members is generally larger than three times the thickness of the organic EL layer and it exceeds 1 μm.

The upper electrode UE continuously covers the plurality of organic EL layers OR and the plurality of partitions 5X. In the example of FIG. 5, the upper electrode UE is depressed between adjacent partitions 5X. The upper electrode UE covers not only the upper surface 53 but also a part of the side surfaces 51 and 52.

Nest, a method of manufacturing the display device DSP will now be described.

FIGS. 6A to 6L are diagrams each showing a part of the manufacturing process of the display device DSP. These figures are cross sections mainly showing the insulating layer 13, the partitions 5X1, 5X2, 5X3 and 5X4 and the lower electrodes LE1, LE2 and LE3, and elements below the insulating layer 13 are omitted.

First, a substrate SUB as shown in FIG. 6A is formed, in which the partitions 5X1, 5X2, 5X3 and 5X4 and the lower electrodes LE1, LE2 and LE3 are disposed on the insulating layer 13.

Then, as shown in FIG. 6*b*, a first organic EL layer OR1*a* is formed on the entire substrate SUB by vapor deposition. The first organic EL layer OR1*a* includes a light-emitting layer EM which emits red light. The first organic EL layer OR1*a* includes a plurality of first portions P1 which respectively cover the lower electrodes LE1, LE2 and LE3 and a plurality of second portions P2 located on the partitions 5X1, 5X2, 5X3 and 5X4, respectively.

The side surfaces 51 and 52 of each of the partitions 5X1, 5X2, 5X3 and 5X4 are substantially parallel to the third direction Z as described above. Thus, the deposition of the first organic EL layer OR1*a* on the side surfaces 51 and 52 is suppressed, and each first portion P1 and each respective second portion P2 are separated from each other. Further, the end surfaces SF1 and SF2 of each first portion P1 are in contact with the side surfaces 51 and 52 of adjacent partitions 5X, respectively.

After the formation of the first organic EL layer OR1*a*, a protective film 61 is formed, for example, by vapor deposition to cover each of the first portions P1 and each of the second portions P2. This protective film 61 is made of, for example, a metal oxide, but the material is not limited to that of this example.

Further, in FIG. 6B, between the partitions 5X1 and 5X2, a resist 71 is formed. The resist 71 is formed by patterning a resist formed on the protective film 61 in the entire substrate SUB. The resist 71 opposes the first portion P1 on the lower electrode LE1 and covers the protective film 61 on the first portion P1.

Figure 6C:
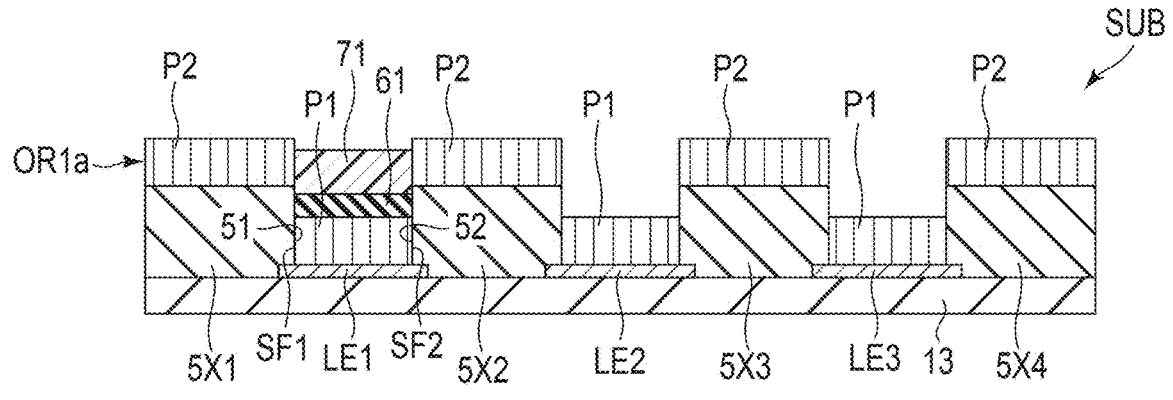
FIG. 6C is a diagram showing a manufacturing process of the display device, which follows that of FIG. 6B.
Figure 6D:
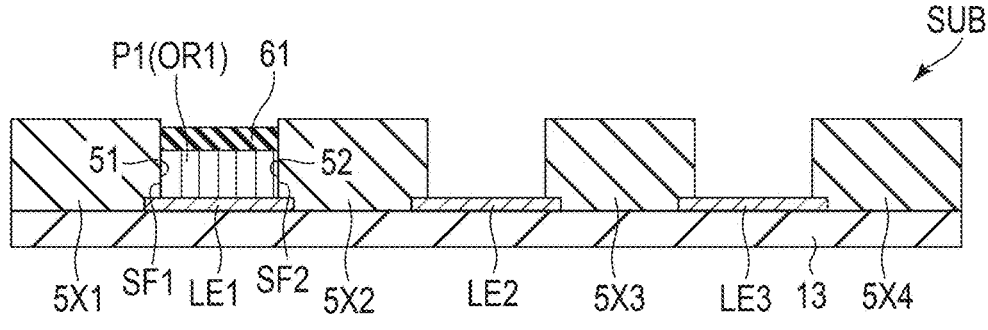
FIG. 6D is a diagram showing a manufacturing process of the display device, which follows that of FIG. 6C.

Next, etching is carried out to remove the protective film 61. Thus, as shown in FIG. 6C, the protective film 61 is removed except for the portion covered by the resist 71. Further, the resist 71 is removed and etching is carried out to remove the first organic EL layer OR1*a*. Thus, as shown in FIG. 6D, the first portion P1 except for the portion covered by the protective film 61 and all of the second portion P2 are removed. The remaining first portion P1 after this etching corresponds to the first organic EL layer OR1 shown in FIG. 3.

Through the processing steps shown in 6A to 6D described above, the first organic EL layer OR1 of a first color (red) is formed in the sub-pixel SP1 of the display area DA. The second organic EL layer OR2 of a second color (green) and the third organic EL layer OR3 of a third color (blue) are formed are formed by processed similar to those shown in FIGS. 6E to 6J.

Figure 6E:
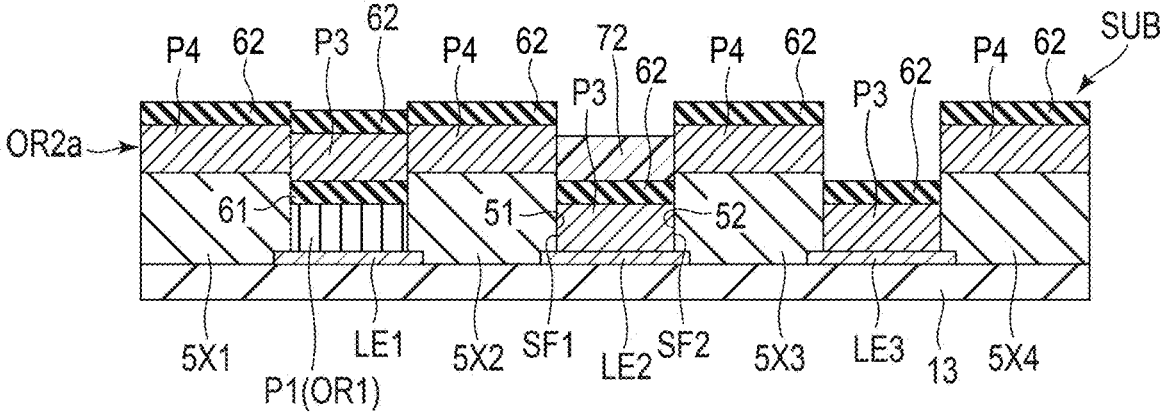
FIG. 6E is a diagram showing a manufacturing process of the display device, which follows that of FIG. 6D.

That is, in the formation of the second organic EL layer OR2, as shown in FIG. 6E, the second organic EL layer OR2*a* is formed on the entire substrate SUB by vapor deposition. The second organic EL layer OR2*a* includes a green light-emitting layer EM. The second organic EL layer OR2*a* includes a plurality of third portions P3 and a plurality of fourth portions P4. Part of the plurality of third portions P3 covers the lower electrodes LE2 and LE3, and the remaining portion covers the protective film 61. The plurality of fourth portions P4 are located on the partitions 5X1, 5X2, 5X3 and 5X4, respectively.

The third portions P3 located on the lower electrodes LE2 and LE3 3 are located apart from the fourth portions P4 located on the partitions 5X1, 5X2, 5X3 and 5X4. On the other hand, in the example of FIG. 6E, the third portion P3 located on the protective film 61 is connected to the fourth portions P4 located on the partitions 5X1 and 5X2. As another example, the third portion P3 located above the protective film 61 may be separated from the fourth portions P4 located on the partitions 5X1 and 5X2. The end surface SF1 of the third portion P3 located on the second lower electrode LE2 is in contact with the side surface 51 of the second partition 5X2, and the end surface SF2 of the third portion P3 is in contact with the side surface 52 of the third partition 5X3.

After the formation of the second organic EL layer OR2a, a protective film 62 is formed to cover each of the third portions P3 and each of the fourth portions P4, for example, by vapor deposition. The protective film 62 is made of, for example, a metal oxide, but the material is not limited to that of this example.

Further, in FIG. 6E, between the partitions 5X2 and 5X3, a resist 72 is provided to cover the protective film 62. This resist 72 is prepared by patterning a resist formed over the entire substrate SUB.

Next, etching is carried out to remove the protective film 62. Thus, as shown in FIG. 6F, the protective film 62 is removed except for the portion covered by the resist 72. Further, the resist 72 is removed and etching is carried out to remove the second organic EL layer OR2a. Consequently, as shown in FIG. 6G, the third portion P3 except for the portion covered by the protective film 62 and all of the fourth portion P4 are removed. The third portion P3 remaining after this etching process corresponds to the second organic EL layer OR2 shown in FIG. 3.

In the formation of the third organic EL layer OR3, as shown in FIG. 6H, the third organic EL layer OR3a is formed on the entire substrate SUB by vapor deposition. The third organic EL layer OR3a includes a blue light-emitting layer EM. The third organic EL layer OR3a includes a plurality of fifth portions P5 and a plurality of sixth portions P6. Part of the plurality of fifth portions P5 covers the third lower electrode LE3, and the remaining portion covers one of the protective films 61 and 62. The plurality of sixth portions P6 are located on the partitions 5X1, 5X2, 5X3 and 5X4, respectively.

The fifth portion P5 located on the third lower electrode LE3 is located apart from the sixth portions P6 located on the partitions 5X3 and 5X4. On the other hand, in the example of FIG. 6H, the fifth portions P5 located on the protective films 61 and 62 connected to the sixth portions P6 located on the partitions 5X1, 5X2 and 5X3, respectively. As another example, the fifth portions P5 located above the protective films 61 and 62 may be located apart from the sixth portions P6 located on the partitions 5X1, 5X2 and 5X3. The end surface SF1 of the fifth portion P5 located on the third lower electrode LE3 is in contact with the side surface 51 of the third partition 5X3, and the end surface SF2 of this fifth portion P5 is in contact with side surface 52 of the fourth partition 5X4.

After the formation of the third organic EL layer OR3a, a protective film 63 is formed by vapor deposition, for example, to cover each of the fifth portions P5 and each of the sixth portions P6. This protective film 63 is made of, for example, a metal oxide, but the material is not limited to that of this example.

Further, in FIG. 6H, between the partitions 5X3 and 5X4, a resist 73 is formed to cover the protective film 63. The resist 73 is prepared by patterning a resist formed on the protective film 63 in the entire substrate SUB.

Figure 6I:
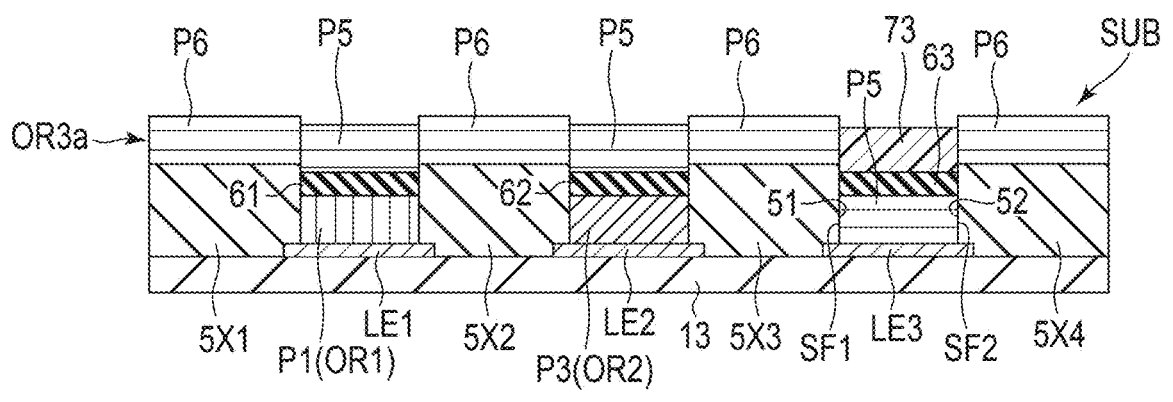
FIG. 6I is a diagram showing a manufacturing process of the display device, which follows that of FIG. 6H.
Figure 6J:
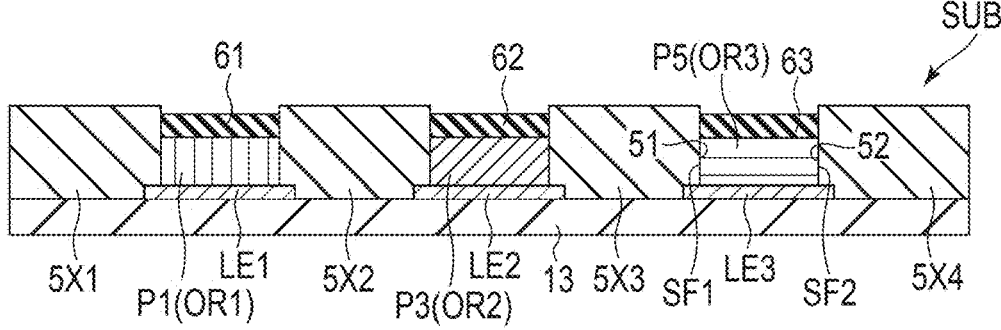
FIG. 6J is a diagram showing a manufacturing process of the display device, which follows that of FIG. 6I.

Next, etching is carried out to remove the protective film 63. As shown in FIG. 6I, the protective film 63 is removed except for the portion covered by the resist 73. Further, the resist 73 is removed, and etching is carried out to remove the third organic EL layer OR3a. Consequently, as shown in FIG. 6J, the fifth portion P5 except for the portion covered by the protective film 63 and all of the sixth portion P6 are removed. The fifth portion P5 remaining after this etching process corresponds to the third organic EL layer OR3 shown in FIG. 3.

Figure 6K:
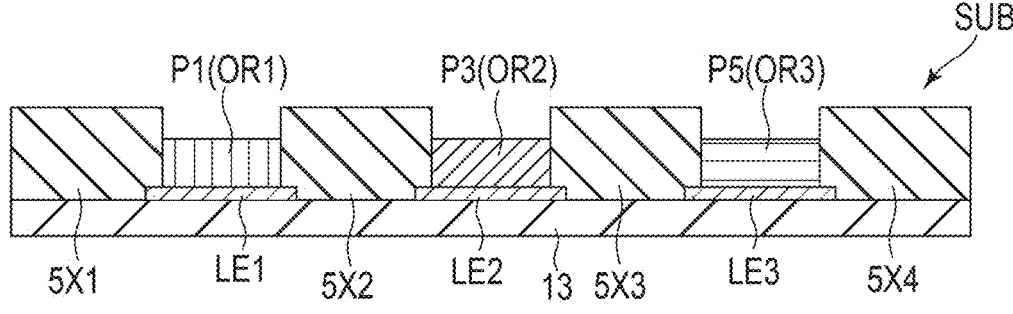
FIG. 6K is a diagram showing a manufacturing process of the display device, which follows that of FIG. 6J.

After the formation of the organic EL layers OR1, OR2 and OR3, as shown in FIG. 6K, protective films 61, 62 and 63 are removed. Further, as shown in FIG. 6L, the upper electrode UE is formed by, for example, vapor deposition to continuously cover the partitions 5X1, 5X2, 5X3 and 5X4 and the organic EL layers OR1, OR2 and OR3. Thereafter, through the formation of the sealing layer 14, etc., the display device DSP is completed.

FIGS. 7A to 7E are diagrams each showing a part of a manufacturing process of the display device DSP in a comparative example to the present embodiment. In the comparative example, first, as shown in FIG. 7A, a substrate SUB is formed, in which the lower electrodes LE1, LE2 and LE3 are formed on the insulating layer 13. Note that the substrate SUB does not include an element corresponding to the partitions 5.

Then, as shown in FIG. 7B, the first organic EL layer OR1a is formed on the entire substrate SUB by vapor deposition. Further, a protective film 61 is formed to cover the first organic EL layer OR1a and a resist 71 is formed above the lower electrode LE1.

Thereafter, etching is carried out to remove the protective film 61. Thus, as shown in FIG. 7C, the protective film 61 is removed except for the portion covered by the resist 71. Further, the resist 71 is removed and etching is carried out to remove the first organic EL layer OR1a. Consequently, as shown in FIG. 7D, the first organic EL layer OR1a is removed except for the portion covered by the protective film 61. The portion remaining after this etching corresponds to the first organic EL layer OR1 placed in the red sub-pixel SP1.

Thereafter, in a procedure similar to that of the first organic EL layer OR1, as shown in FIG. 7E, the second organic EL layers OR2 of the green sub-pixel SP2 and the third organic EL layer OR3 of the blue sub-pixel SP3 are formed.

In the manufacturing method of the comparative example, the end surfaces SF1 and SF2 of each of the organic EL layers OR1, OR2 and OR3 are exposed to the atmosphere during the manufacturing process of the display device. In this case, through the end surfaces SF1 and SF2, moisture may enter the organic EL layers OR1, OR2 and OR3.

In contrast, in the manufacturing method of this embodiment shown in FIGS. 6A to 6L, the end surfaces SF1 and SF2 of each of the organic EL layers OR1, OR2 and OR3 (the first portions P1, P3 and P5) are in contact with side surfaces 51 and 52 of each of the partitions 5X1, 5X2, 5X3 and 5X4, respectively. In this manner, it is possible to suppress moisture entering through the end surfaces SF1 and SF2.

Further, until the step shown in FIG. 6J, the upper surfaces of the organic EL layers OR1, OR2 and OR3 are covered by the protective films 61, 62 and 63, respectively. Thus, the entire or substantially entire surface of each of the organic EL layers OR1, OR2 and OR3 is not exposed to the atmosphere, and thus the entering of moisture can be more appropriately suppressed.

In the manufacturing method of the comparative example, the protective films 61, 62 and 63 are removed from the state shown in FIG. 7E, and the upper electrode UE is formed to continuously cover the organic EL layers OR1, OR2 and OR3. Here, when the organic EL layers OR1, OR2 and OR3 are thick, the upper electrode UE may be interrupted near the end surfaces SF1 and SF2.

In contrast, in this embodiment, the thickness T1 of the partitions 5X is adjusted to an appropriate value, and thus it is possible to suppress the interruption of the upper electrode UE. For example, when the thickness T1 of the partitions 5X is less than twice the thickness T2 of the organic EL layer OR, the height of the step between the partitions 5X and the organic EL layer OR becomes less than the thickness T2. In this case, the unevenness of the underlying layer of the upper electrode UE becomes more gradual than that of the comparative case, and thus the upper electrode UE is less likely to be interrupted.

In the display device DSP thus completed, when the end surfaces SF1 and SF2 are in contact with the side surfaces 51 and 52, it is possible to prevent moisture from entering through the end surfaces SF1 and SF2. Thus, the reliability of the display device DSP can be is improved.

Further, the end surfaces SF1 and SF2 are in contact with the side surfaces 51 and 52, and thus it is possible to avoid the first functional layer F1 shown in FIG. 4, for example, from being brought into contact with the upper electrode U without mediating the light-emitting layer EM and the functional layer F2 therebetween, or prevent the light emitting layer EM from being brought into contact with the upper electrode U without mediating the second functional layer F2 therebetween. As a result, the generation of leakage current in the display element 20 can be suppressed and the display quality of the display device DSP can be improved.

In addition to the above, various other suitable effects can be obtained from this embodiment. Further, this embodiment can be modified into various forms. Some of modified examples will now be disclosed.

Figure 8A:
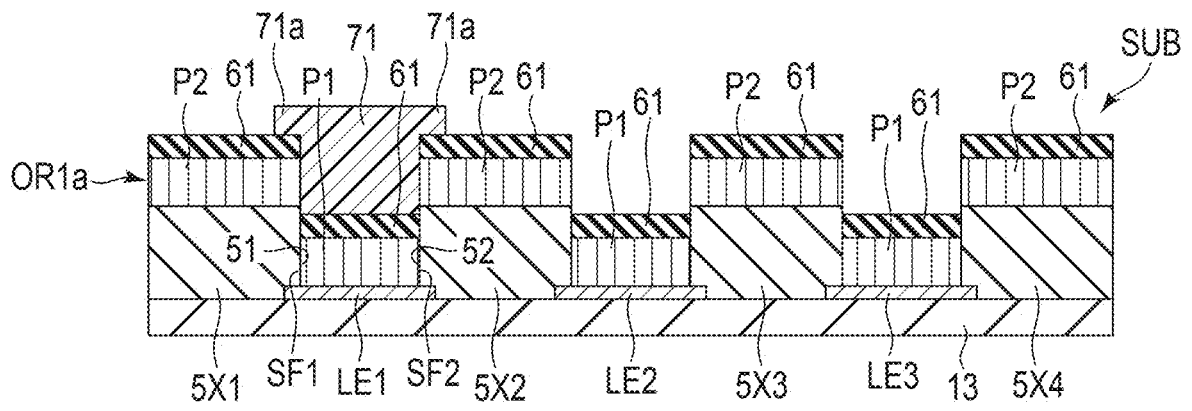
FIG. 8A is a diagram showing a part of a manufacturing process of a display device according to the first modified example.
Figure 8B:
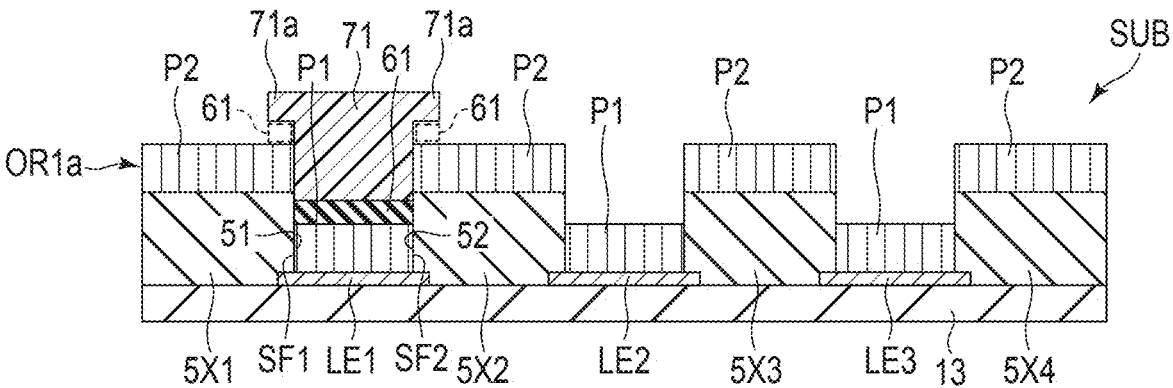
FIG. 8B is a diagram showing a manufacturing process of the display device, which follows that of FIG. 8A.
Figure 9A:
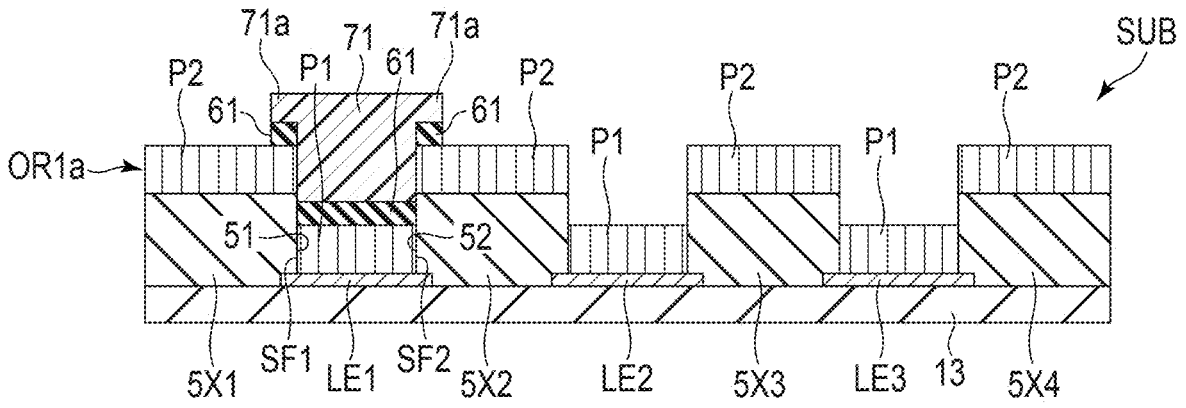
FIG. 9A is a diagram showing a part of a manufacturing process according to a comparative example to the first modified example.
Figure 9B:
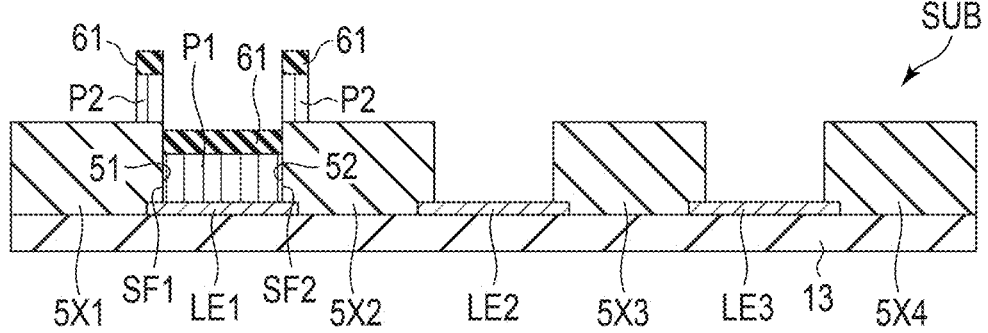
FIG. 9B is a diagram showing a manufacturing process, which follows that of FIG. 9A.

FIGS. 8A and 8B are diagrams each showing a part of a manufacturing process according to the first modified example. FIGS. 9A and 9B are diagrams each showing a part of a manufacturing process a comparative example to this modified example.

In FIG. 8A, a first organic EL layer OR1a, a protective film 61 and a resist 71 are formed on a substrate SUB as in the case of FIG. 6B. Note here that the width of the resist 71 is larger and a part thereof protrudes upwards from the partitions 5X1 and 5X2. The portion of the resist 71, which protrudes above the partitions 5X1 and 5X2 is referred to as an expanded portion 71a, hereinafter.

In the case where the resist 71 includes the expanded portion 71a, when the first organic EL layer OR1a is removed by anisotropic etching, the protective film 61 may remain under the expanded portion 71a as shown in FIG. 9A. If the protective film 61 remains under the expanded portion 71a, the second portion P2 may partially remain on the partitions 5X1 and 5X2 even after etching of the first organic EL layer OR1a as shown in FIG. 9B. Such parts of the second portion P2 may cause interruption of the upper electrode UE that is deposited subsequently.

Under these circumstances, in this modified example, the protective film 61 is removed by isotropic etching. In this case, as shown in FIG. 8B, the protective film 61 under the expanded portion 71a can be removed as well. After that, the resist 71 is removed and etching is carried out to remove the first organic EL layer OR1a. Thus, a substrate SUB similar to that of FIG. 6D can be obtained. Note that isotropic etching may be used to remove the first organic EL layer OR1a.

As shown in FIGS. 8A and 8B, when the end surfaces SF1 and SF2 are in contact with the side surfaces 51 and 52 of the partitions 5X1 and 5X2, respectively, the first portion P1 on the first lower electrode LE1 is never eroded from the end surfaces SF1 and SF2 in the isotropic etching to remove the protective film 61 and the first organic EL layer OR1a.

In the case where the resist 71 does not include the expanded portion 71a, if exposure light is deviated during the formation of the resist 71, the erosion may proceed to the protective film 61 below the resist 71 in the etching process to remove the protective film 61. In this case, the first portion P1 on the first lower electrode LE1 may be eroded in the etching to remove the first organic EL layer OR1a. In contrast, when the resist 71 includes the expanded portion 71a as in this modified example, the resist 71 which can cover the entire protective film 61 above the first lower electrode LE1 can be formed even if deviation of exposure light occurs during the formation of the resist 71. As a result, the first organic EL layer OR1 can be formed with high accuracy.

Here, the case where the resist 71 includes an expanded portion 71a is described as an example, but the resists 72 and 73 may include a similar expanded portion, and the protective films 62 and 63 may be removed by isotropic etching. Alternatively, for removal of the organic EL layers OR2a and OR3, isotropic etching may be used. When the resists 72 and 73 include an expanded portion, the organic EL layers OR2 and OR3 can be formed with high accuracy as in the case of the first organic EL layer OR1.

FIG. 10 is a diagram showing an example of the layout of sub-pixels SP1, SP2 and SP3 according to the second modified example. In the modified example, the partitions 5 do not include the partition 5Y shown in FIG. 2. Further, the organic EL layers OR1, OR2 and OR3 extend linearly along the second direction Y between each adjacent pair of partitions 5X.

The first organic EL layer OR1 overlaps a plurality of first lower electrodes LE1 aligned along the second direction Y. The second organic EL layer OR2 overlaps a plurality of second lower electrodes LE2 aligned along the second direction Y. The third organic EL layer OR3 overlaps a plurality of third lower electrodes LE3 aligned along the second direction Y.

In addition to this modified example, the layout of the sub-pixels SP1, SP2, SP3 3 can be modified into various ways.

All of the display devices and their manufacturing methods that can be implemented by a person of ordinary skill in the art through arbitrary design changes to the display devices and their manufacturing methods described above as the embodiment and its modified examples of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiments by adding or deleting a structural element or changing the design of a structural element, or adding or omitting a step or changing the condition of a step, all of the modifications fall within the scope of the present invention as long as they are in keeping with the spirit of the invention.

Further, other effects which may be obtained from each of the above embodiments and modified examples and are self-explanatory from the descriptions of the specification or can be arbitrarily conceived by a person of ordinary skill in the art are considered to be naturally brought about by the present invention as a matter of course.

13

14

What is claimed is:

1. A method of manufacturing a display device, comprising:

forming a substrate including a pair of partitions and a lower electrode disposed between the pair of partitions;

forming an organic EL layer including a first portion having a pair of end surfaces which cover the lower electrode and are in contact with side surfaces of the pair of partitions, and a second portion located on each of the pair of partitions and spaced apart from the first portion;

forming a protective film which covers the organic EL layer;

forming a resist opposing the first portion, on the protective film, removing the protective film on the second portion;

removing the second portion by etching after the removing of the protective film; and forming an upper electrode which covers the first portion.

2. The method of claim 1, wherein the side surfaces of the pair of partitions are substantially parallel to a thickness direction of the substrate.

3. The method of claim 1, wherein the pair of partitions have a thickness less than or equal to three times a thickness of the organic EL layer.

4. The method of claim 1, wherein the protective film is removed by isotropic etching.

5. A method for manufacturing a display device, comprising:

forming a substrate including a first partition, a second partition, a third partition and a fourth partition, a first lower electrode disposed between the first partition and the second partition, a second lower electrode disposed between the second partition and the third partition, and a third lower electrode disposed between the third partition and the fourth partition;

forming a first organic EL layer including a first portion and a second portion, the first portion covering the first lower electrode and having a pair of end surfaces which are in contact with side surfaces of the first partition and the second partition respectively, the second portion being located on the first partition and the second partition and spaced apart from the first portion;

forming a first protective film which covers the first organic EL layer;

forming a first resist opposing the first portion on the first protective film;

removing the first protective film on the second portion;

removing the second portion by first etching after the removing of the first protective film;

forming a second organic EL layer including a third portion and a fourth portion, the third portion covering the second lower electrode and having a pair of end surfaces which are in contact with side surfaces of the second partition and the third partition, respectively, the fourth portion being located on the second partition and the third partition and spaced apart from the third portion;

removing the fourth portion by second etching;

forming a third organic EL layer including a fifth portion and a sixth portion, the fifth portion covering the third lower electrode and having a pair of end surfaces which are in contact with side surfaces of the third partition and the fourth partition, respectively, the sixth portion being located on the third partition and the fourth partition and spaced apart from the fifth portion;

removing the sixth portion by third etching; and forming an upper electrode which covers the first portion, the third portion and the fifth portion.

6. The method of claim 5, wherein the side surfaces of the first partition, the second partition, the third partition and the fourth partition are substantially parallel to a thickness direction of the substrate.

7. The method of claim 5, wherein a thickness of the first partition, the second partition, the third partition and the fourth partition is less than or equal to three times a thickness of the first organic EL layer, the second organic EL layer or the third organic EL layer.

8. The method of claim 5, wherein the first protective film is removed by isotropic etching.

9. The method of claim 5, further comprising:

forming a second protective film which covers the second organic EL layer;

forming a second resist opposing the third portion, on the second protective film; and removing the second protective film on the fourth portion, wherein the fourth portion is removed by the second etching after the removing of the second protective film.

10. The method of claim 9, wherein the second protective film is removed by isotropic etching.

11. The method of claim 9, further comprising:

forming a third protective film which covers the third organic EL layer;

forming a third resist opposing the fifth portion, on the third protective film; and removing the third protective film on the sixth portion, wherein the sixth portion is removed by the third etching after the removing of the third protective film.

12. The method of claim 11, wherein the third protective film is removed by isotropic etching.

* * * * *